(12) United States Patent
Kim et al.

(10) Patent No.: US 9,831,395 B2
(45) Date of Patent: Nov. 28, 2017

(54) LIGHT EMITTING DEVICE WITH PACKAGING HAVING AN ADHESIVE IN A GROOVE FOR ATTACHING A TRANSPARENT COVER

(71) Applicant: LG INNOTEK CO., LTD., Seoul (KR)

(72) Inventors: Baek Jun Kim, Seoul (KR); Hiroshi Kodaira, Seoul (KR); Ki Man Kang, Seoul (KR); Ha Na Kim, Seoul (KR); Hyun Don Song, Seoul (KR); Jung Woo Lee, Seoul (KR); Jung Hun Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/978,741

(22) Filed: Dec. 22, 2015

(65) Prior Publication Data

US 2016/0181479 A1    Jun. 23, 2016

(30) Foreign Application Priority Data

Dec. 23, 2014 (KR) .......................... 10-2014-0186826
Jan. 30, 2015 (KR) .......................... 10-2015-0015562

(51) Int. Cl.
    *H01L 33/48*      (2010.01)
    *H01L 33/58*      (2010.01)
    *H01L 33/62*      (2010.01)

(52) U.S. Cl.
    CPC ............ *H01L 33/486* (2013.01); *H01L 33/58* (2013.01); *H01L 33/62* (2013.01);
(Continued)

(58) Field of Classification Search
    CPC ....... H01L 33/486; H01L 33/58; H01L 33/62; H01L 2933/0033; H01L 2933/0058
See application file for complete search history.

(56) References Cited

U.S. PATENT DOCUMENTS

| 6,610,563 B1 * | 8/2003 | Waitl ................. H01L 31/0203 257/E31.117 |
| 2005/0072981 A1 * | 4/2005 | Suenaga ............... H01L 33/486 257/88 |

(Continued)

FOREIGN PATENT DOCUMENTS

| EP | 2 523 230 A2 | 11/2012 |
| EP | 3 001 466 A1 | 3/2016 |

(Continued)

*Primary Examiner* — Kevin Parendo
(74) *Attorney, Agent, or Firm* — Birch, Stewart, Kolasch & Birch, LLP

(57) ABSTRACT

A light emitting device includes a body having a cavity and a step difference structure around the cavity, a plurality of electrodes in the cavity, a light emitting chip in the cavity, a transparent window having an outer portion provided on the step difference structure to cover the cavity, and an adhesive member between the transparent window and the body. The adhesive member includes a first adhesive member between an outer bottom surface of the transparent window and a bottom of the step difference structure and a second adhesive member between the outer portion of the transparent window and the body.

15 Claims, 12 Drawing Sheets

(52) U.S. Cl.
CPC ............ *H01L 2224/48091* (2013.01); *H01L 2224/73265* (2013.01); *H01L 2924/16195* (2013.01); *H01L 2933/0058* (2013.01)

(56) References Cited

U.S. PATENT DOCUMENTS

| | | | | |
|---|---|---|---|---|
| 2009/0278153 | A1* | 11/2009 | Cho | H01L 33/58 |
| | | | | 257/98 |
| 2011/0089449 | A1* | 4/2011 | Chou | H01L 33/486 |
| | | | | 257/98 |
| 2011/0210370 | A1* | 9/2011 | Kamamori | H01L 33/62 |
| | | | | 257/99 |
| 2012/0267671 | A1* | 10/2012 | Jung | H01L 33/486 |
| | | | | 257/99 |
| 2012/0286319 | A1 | 11/2012 | Lee et al. | |
| 2013/0234274 | A1* | 9/2013 | Kam | H01L 33/58 |
| | | | | 257/432 |
| 2016/0126426 | A1* | 5/2016 | Kim | H01L 33/486 |
| | | | | 257/98 |

FOREIGN PATENT DOCUMENTS

| | | | |
|---|---|---|---|
| KR | 10-2012-0119153 A | | 10/2012 |
| KR | 10-2012-0122735 A | | 11/2012 |
| KR | 10-2013-0063421 A | | 6/2013 |
| KR | 10-2013-0101467 | * | 9/2013 |
| KR | 10-2013-0101467 A | | 9/2013 |
| WO | WO 2014/189221 A1 | | 11/2014 |

* cited by examiner

LIGHT EMITTING DEVICE WITH PACKAGING HAVING AN ADHESIVE IN A GROOVE FOR ATTACHING A TRANSPARENT COVER

CROSS-REFERENCE TO RELATED APPLICATION

This application claims under 35 U.S.C. §119 to Korean Patent Application No. 10-2014-0186826 (filed Dec. 23, 2014), and Korean Patent Application No. 10-2015-0015562 (filed Jan. 30, 2015), which are hereby incorporated by references in there entireties.

BACKGROUND

In general, a nitride semiconductor material including a source, such as nitrogen (N) of group V and a source, such as gallium (Ga), aluminum (Al), or indium (In), of group III has excellent thermal stability and a direct transition energy band structure. Accordingly, the nitride semiconductor material has been extensively used as a material for a nitride semiconductor device, that is, a UV nitride semiconductor, and a solar cell material.

The nitride-based material has a wide energy bandgap in a range of 0.7 eV to 6.2 eV, which is matched with the spectrum of the solar cell. Accordingly, the nitride material has been mainly used as a material for the solar cell. In particular, the UV light emitting device has been utilized in various industrial fields, such as a hardening device, a medical analyzer, curing equipment, and a sterilization and purification system. The UV light emitting device has been spotlighted as a material available to typical lighting as a semiconductor lighting light source in the future.

BRIEF SUMMARY

The embodiment provides a light emitting device having a transparent window in a sealing structure.

According to the embodiment, there is provided a light emitting device including a body having a cavity and a stepped structure around the cavity, a plurality of electrodes in the cavity, a light emitting chip in the cavity, a transparent window having an outer portion provided on the stepped structure to cover the cavity, and an adhesive member between the transparent window and the body. The adhesive member includes a first adhesive member between an outer bottom surface of the transparent window and a bottom of the stepped structure and a second adhesive member between the outer portion of the transparent window and the body.

DETAILED DESCRIPTION OF THE EMBODIMENTS

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
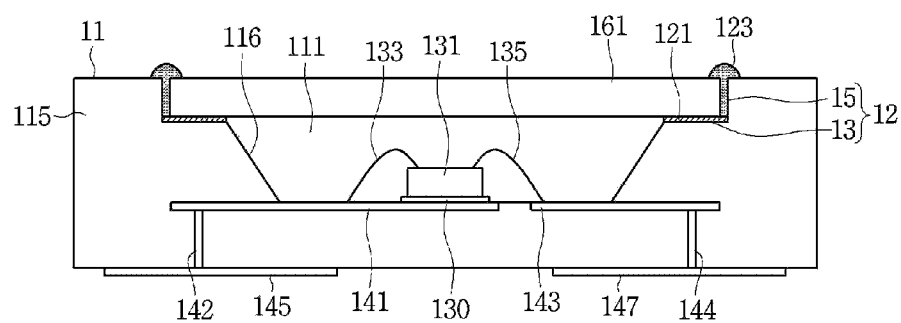
FIG. 1 is a sectional view showing a light emitting device according to a first embodiment.
Figure 2:
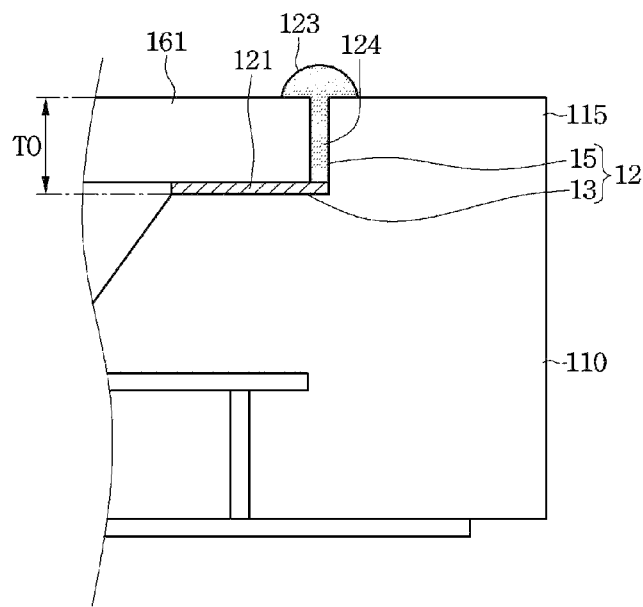
FIG. 2 is a partial enlarged view showing the light emitting device of FIG. 1.

FIG. 1 is a sectional view showing a light emitting device according to a first embodiment. FIG. 2 is a partial enlarged view showing the light emitting device of FIG. 1.

Referring to FIGS. 1 and 2, a light emitting device 100 includes a body 110 including a cavity 111 having an open upper portion, a plurality of electrodes 141 and 143 provided in the cavity 111, a plurality of electrodes 141 and 143 provided in the cavity 111, a light emitting chip 131 provided in the cavity 111 and electrically connected with the electrodes 141 and 143, a plurality of first and second lead electrodes 145 and 147 provided on a bottom surface of the body 110, a transparent window 161 on the cavity 111, and adhesive members 121 and 123 between an outer portion of the transparent window 161 and the body 110.

The body 110 includes a ceramic material, and the ceramic material includes low temperature co-fired ceramic (LTCC) or high temperature co-fired ceramic (HTCC). According to another example, the body 110 may include an insulating member including a nitride or an oxide. Preferably, the body 110 may include a metallic nitride having thermal conductivity higher than that of the oxide or the nitride. The material of the body 110 may include $SiO_2$, $Si_xO_y$, $Si_3N_4$, $Si_xN_y$, $SiO_xN_y$, $Al_2O_3$, or AlN, and may include a metallic nitride having the thermal conductivity of 140 W/mK or more.

The body 110 includes a reflective part 115, and the reflective part 115 is provided at the circumference of the cavity 111 to reflect light emitted from a light emitting chip 131.

The cavity 111 is an area of an upper portion of the body 110 formed at a depth lower than a top surface 11 of the body 110 and has an open upper portion. In this case, an upper direction of the cavity 111 may be a direction that light emitted from the light emitting chip 131 is extracted.

The cavity 111 may have a circular shape, an oval shape, or a polygonal shape when viewed from a top view. The cavity having the polygonal shape may have the shape of a curved surface formed as a corner of the cavity 111 is chamfered.

The cavity 111 may have a wider width at an upper portion than that at a lower portion. According to another example, the cavity 111 may have equal widths at the upper and lower portions thereof. A sidewall 116 of the cavity 111 may be inclined or perpendicular with respect to a bottom of the cavity 111, but the embodiment is not limited thereto.

A metallic layer may be provided on the sidewall 116 of the cavity 111. The metallic layer may be coated with reflective metal or metal having high thermal conductivity. The metallic layer can improve the light extraction efficiency in the cavity 111 to improve a heat radiation characteristic.

The transparent window 161 may be spaced apart from the light emitting chip 131. As the transparent window 161 is spaced apart from the light emitting chip 131, the transparent window 161 may be prevented from being inflated due to the heat emitted from the light emitting chip 131. The area of the cavity 111 under the transparent window 161 may be an empty space or may be filled with a non-metal chemical element or a metal chemical element.

The stepped structure 12 is provided at an upper portion of the body 110, that is, inside the reflective part 115. The stepped structure 12 may be provided at an upper circumference of the cavity 111.

The stepped structure 12 is provided at an area lower than the top surface 11 of the body 110 and includes a bottom 13 and a lateral side 15. The lateral side 15 of the stepped structure 12 may be a perpendicular surface or an inclined surface with respect to the floor 13. The stepped structure 12 may be provided at an area between the sidewall 116 of the cavity 111 and the top surface 11 of the body 110.

The body 110 may be coupled to a plurality of electrodes 141, 142, 143, 144, 145, and 147. The electrodes 141, 142, 143, 144, 145, and 147 may include the first electrode 141 and the second electrode 143 provided in the cavity 111, the first and second lead electrodes 145 and 147 provided on the bottom surface of the body 110, the first connection electrode 142 provided in the body 110 to connect the first electrode 141 with the first lead electrode 145, and the second connection electrode 144 to connect the second electrode 143 with the second lead electrode 147.

The first electrode 141 and the second electrode 143 may extend from the bottom of the cavity 111 into the body 110. The first electrode 141 may be connected with the first lead electrode 145 through the first connection electrode 142, and the second electrode 143 may be connected to the second connection electrode 147 through the second connection electrode 144.

The first and second lead electrodes 145 and 147 are provided on the bottom surface of the body 110 to supply power and radiate heat transferred from the body 110. The area of the bottom surface of the first lead electrode 145 or the second lead electrode 147 may be wider than an area of the top surface of the first electrode 141 or the second electrode 143. At least one of the first and second lead electrodes 145 and 147 may include a plurality of lead electrodes.

At least one of the first and second connection electrodes 142 and 144 may include a plurality of connection electrodes. The first and second connection electrodes 142 and 144 may have via structures and may be electrically connected with an internal circuit pattern of the body 110.

The electrodes 141, 142, 143, 144, 145, and 147 may selectively include a metallic layer, for example platinum (Pt), titanium (Ti), copper (Cu), nickel (Ni), gold (Au), tantalum (Ta), or aluminum (Al). Each of the electrodes 141, 142, 143, 144, 145, and 147 may be formed at a single layer or a multiple layer. In the multiple-layer electrode structure, Au having an excellent bonding property may be provided at the uppermost layer, Ti, Cr, and Ta having an excellent adhesive property may be provided at the lowermost layer, and Pt, Ni, and Cu may be provided at the intermediate layer, but the embodiment is not limited to the lamination structure of the electrode.

The light emitting chip 131 may be provided in the cavity 111. The light emitting chip 131 may be provided on at least one of the first and second electrodes 141 and 143. When the light emitting chip 131 is provided on the first electrode 141, a bonding member 130 may bond the first electrode 141 to the light emitting chip 131. The light emitting chip 131 may be bonded in the cavity 111 through a flip-chip bonding scheme, but the embodiment is not limited thereto.

According to another embodiment, the light emitting chip 131 may be provided on the first and second electrodes 141 and 143. According to another embodiment, the light emitting chip 131 may be provided on the body 110 instead of the first and second electrodes 141 and 143. According to another embodiment, the light emitting chip 131 may be provided on a heat radiation plate electrically insulated from the first and second electrodes 141 and 143 and including a metallic material, but the embodiment is not limited thereto.

The light emitting chip 131 may be connected with the first and second electrodes 141 and 143 through connection members 133 and 135. The connection members 133 and 135 include conductive wires.

The light emitting chip 131 may include an ultra-violet light emission diode having the wavelength band in the range of 200 nm to 405 nm. In other words, the light emitting chip 131 may emit the wavelength of 200 nm to 289 nm, the wavelength of 290 nm to 319 nm, or the wavelength of 320 nm to 405 nm. A protective device may be further provided in the cavity 111, but the embodiment is not limited thereto.

The transparent window 161 is provided on the body 110. The transparent window 161 may cover the cavity 111 and may be coupled to the body 110. The top surface of the transparent window 161 may be a flat surface, a concave surface, or a convex surface. The bottom surface of the transparent window 161 may be a flat surface, a concave surface or a convex surface.

The transparent window 161 may include a glass-based material. For example, the transparent window 161 may include LiF, $MgF_2$, $CaF_2$, $BaF_2$, $Al_2O_3$, $SiO_2$ or a transparent material of optical glass (N-BK7), and $SiO_2$ may include a Quartz crystal or UV Fused Silica. In addition, the transparent window 161 may include low iron glass.

A double bonded structure or a double sealing structure may be provided in the area between the transparent window 161 and the body 110.

The outer portion of the transparent window 161 is provided on the stepped structure 12 of the body 110. The depth T0 to a bottom 13 of the stepped structure may be equal to that of the transparent window 161 or may be lower than the bottom surface of the transparent window 161, or may be lower than the depth between the top surface 11 of the body 110 to the bottom surface of the transparent window 161, but the embodiment is not limited thereto.

The adhesive members 121 and 123 include the first adhesive member 121 provided between the bottom surface of the transparent window 161 and the bottom 13 of the stepped structure 12, and the second adhesive member 123 provided between the transparent window 161 and the top surface of the body 110. The first adhesive member 121 may bond an outer bottom surface of the transparent window 161 to the stepped structure 12, and the second adhesive member 123 may bond an outer bottom surface of the transparent window 161 to the top surface 11 of the body 110.

The second adhesive member 123 may have a width greater than an interval between the outer top surface of the transparent window 161 and the top surface 11 of the body 110 to cover the gap between the transparent window 161 and the body 110. The second adhesive member 123 may be provided along each lateral side of the transparent window 161 and protrude upward of the top surface 11 of the body 110. A portion of the second adhesive member 123 protruding upward of the top surface 11 of the body 110 may have a hemi-spherical shape, an oval shape, or a polygonal shape, but the embodiment is not limited thereto.

A portion 124 of the second adhesive member 123 may be provided between the lateral side of the transparent window 161 and the lateral side 15 of the stepped structure 12 for the adhesion between the lateral side of the transparent window 161 and the lateral side 15 of the stepped structure 12. The portion 124 of the second adhesive member 123 may be bonded to the first adhesive member 121.

The first and second adhesive members 121 and 123 are bonded to the body 110, thereby blocking moisture from being infiltrated into the area between the transparent window 161 and the body 110. In addition, the first and second adhesive members 121 and 123 may provide a long infiltration path of moisture to block the infiltration of the moisture. The first and second adhesive members 121 and 123 may fix the transparent window 161 and block the infiltration of moisture.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials. For example, the first adhesive member 121 may include the Teflon film, and the second adhesive member 123 may include silicon. When the first and second adhesive members 121 and 123 include mutually different materials, the infiltration of moisture can be effectively blocked by the interfacial area between the two adhesive members 121 and 123.

Figure 3:
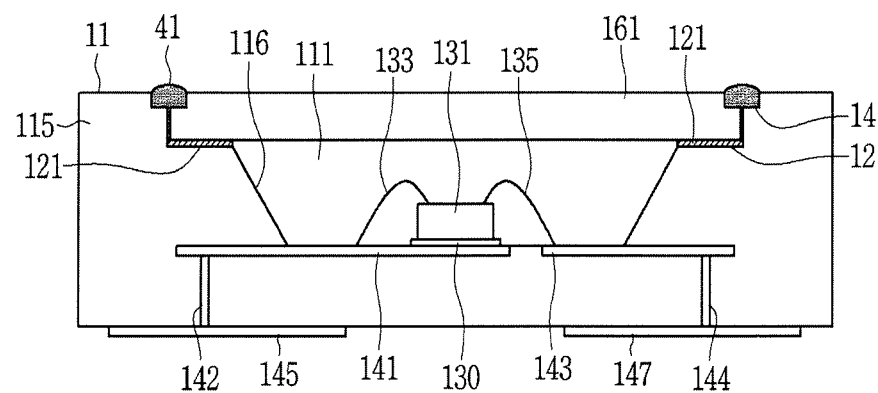
FIG. 3 is a sectional view showing a light emitting device according to a second embodiment.
Figure 4:
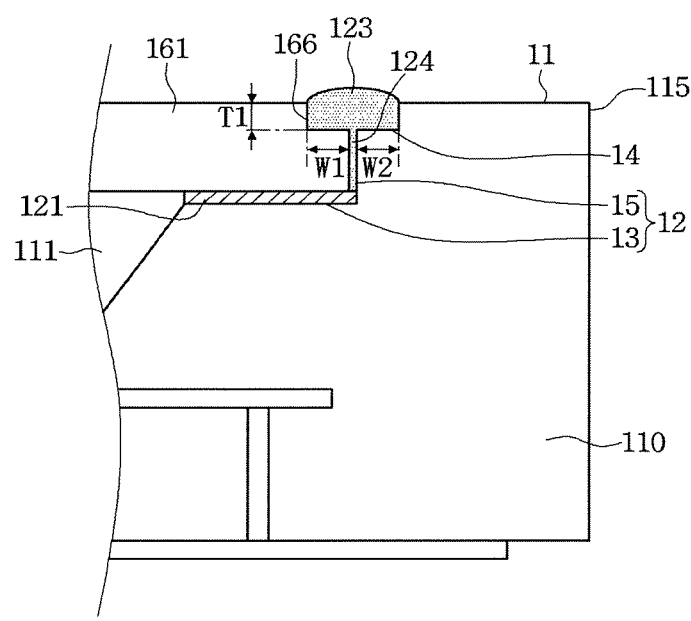
FIG. 4 is a partial enlarged view showing the light emitting device of FIG. 3.

FIG. 3 is a sectional view showing a light emitting device according to a second embodiment. FIG. 4 is a partial enlarged view showing the light emitting device of FIG. 3. In the following description of the second embodiment, the same elements as those of the first embodiment will be understood by making reference to the description of the first embodiment.

Referring to FIGS. 3 and 4, the light emitting device includes a body 110 having a cavity 111, a plurality of electrodes 141 and 143 coupled to the body 110, a plurality of first and second lead electrodes 145 and 147 provided on a bottom surface of the body 110, a light emitting chip 131 provided in the cavity 111, a transparent window 161 on the cavity 111, and adhesive members 121 and 123 between an outer portion of the transparent window 161 and the body 110.

The body 110 includes a stepped structure 12 in which the transparent window 161 is securely mounted, and a second recess 14 interposed between the stepped structure 12 and a top surface of the body 110.

The transparent window 161 is provided at an outer circumference thereof with a first recess 166 lower than a top surface of the transparent window 161. The first recess 166 may be provided at a depth T1 equal to or lower than that of the bottom of the second recess 14 of the body 110. The first recess 166 may have a depth equal to or less than a thickness of an outer lower portion of the transparent window 161. If the first recess 166 has an excessively deep depth T1, the stiffness in the outer portion of the transparent window 161 may be weakened. If the first recess 166 has an excessively shallow depth T1, an effect of improving the adhesive strength may not be produced.

The adhesive members 121 and 123 include the first adhesive member 121 provided on the stepped structure 12 and the second adhesive member 123 provided on the first recess 166 of the transparent window 161.

The first adhesive member 121 bonds an outer bottom surface of the transparent window 161 to a bottom 13 of the stepped structure 12. The second adhesive member 123 is provided on the first recess 166 of the transparent window 161 and the second recess 14 of the body 10.

The first recess 166 and the second recess 14 may have widths W1 and W2 equal to or different from each other. For example, the width W2 of the second recess 14 may be wider than the width W1 of the first recess 166 to maintain the stiffness in an outer portion of the transparent window 161 and increases the adhesive area. The second recess 14 may not be formed.

A portion 124 of the second adhesive member 123 may extend between the lateral side of the transparent window 161 and the lateral side of the stepped structure 12 to bond the lateral side of the transparent window 161 to the lateral side of the stepped structure 12.

A top surface of the second adhesive member 123 may protrude upward of the top surface of the body 110 or the top surface of the transparent window 161, and may be a curved surface or a flat surface. According to another example, the second adhesive member 123 extends to the top surface of the body 110 and the outer top surface of the transparent window 161.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

Figure 5:
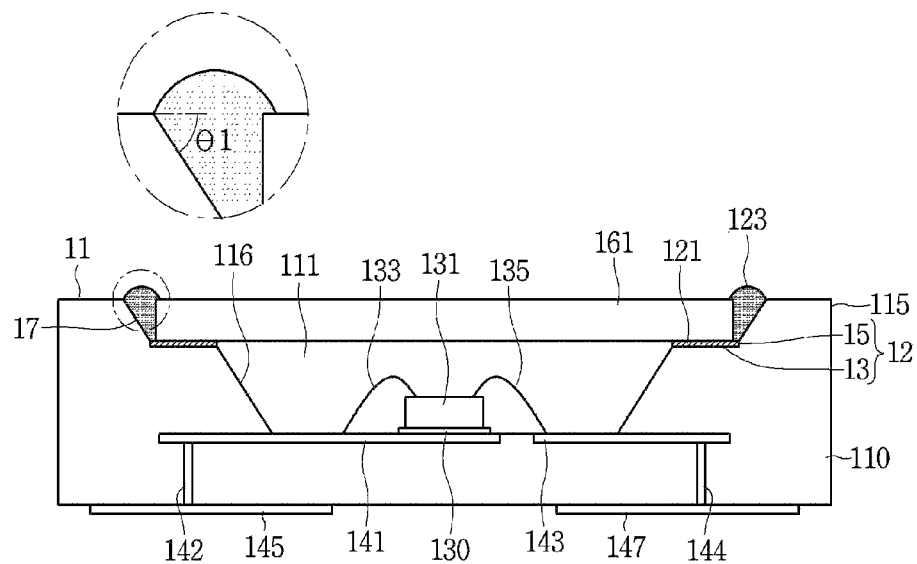
FIG. 5 is a sectional view showing a light emitting device according to a third embodiment.

FIG. 5 is a sectional view showing a light emitting device according to a third embodiment. In the following description of the third embodiment, the same elements as those of the disclosed embodiment will be understood by making reference to the description of the disclosed embodiment.

Referring to FIG. 5, the light emitting device includes a body 110 having a cavity 111, a plurality of electrodes 141 and 143 coupled to the body 110, a plurality of first and second lead electrodes 145 and 147 provided on a bottom surface of the body 110, a light emitting chip 131 provided in the cavity 111, a transparent window 161 on the cavity 111, and adhesive members 121 and 123 between an outer portion of the transparent window 161 and the body 110.

The body 110 includes a stepped structure 12 in which the transparent window 161 is securely mounted, and an inclined structure 17 inclined between the stepped structure 12 and a top surface 11 of the body 110.

The inclined structure 17 includes an inclined surface extending from a lateral side 15 of the stepped structure 12 to the top surface 11 of the body 110. The inclined structure 17 is inclined at an angle ($\theta1$) in a range of 15° to 50° from the top surface 11 of the body 110. If the angle ($\theta1$) is less than the range, a great adhesion effect may not be produced. If the angle ($\theta1$) is greater than the range, the stiffness in an outer upper portion of the body 110 may be weakened.

The adhesive members 121 and 123 include the first adhesive member 121 interposed between an outer bottom surface of the transparent window 161 and a floor 13 of the stepped structure 12 and the second adhesive member 123 interposed between an outer portion of the transparent window 161 and the inclined structure 17.

Since the second adhesive member 123 is interposed between the outer portion of the transparent window 161 and the inclined structure 17, the adhesive strength between the outer lateral side of the transparent window 161 and the second adhesive member 123 may be increased. The second adhesive member 123 may extend to the top surface of the body 110 and the outer top surface of the transparent window 161.

The first and second adhesive members 121 and 123 may block moisture from being infiltrated into the area between the transparent window 161 and the body 110. In addition, the second adhesive member 123 may lengthen an infiltration path of moisture to be infiltrated through the surface of the body 110, by the inclined structure 17, so that the moisture may be effectively blocked.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

Figure 6:
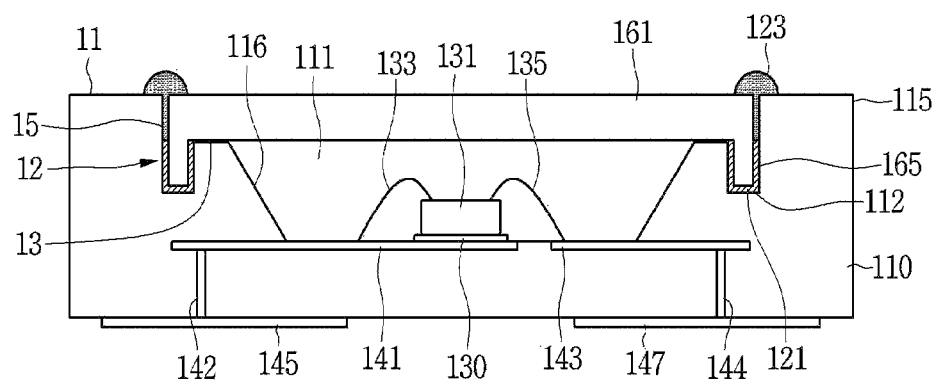
FIG. 6 is a sectional view showing a light emitting device according to a fourth embodiment.
Figure 7:
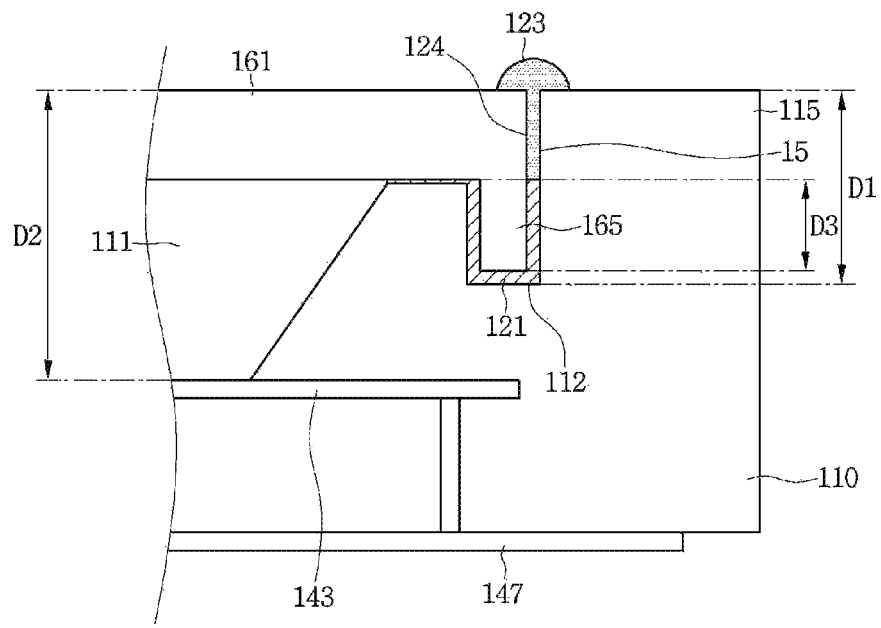
FIG. 7 is a partial enlarged view showing the light emitting device of FIG. 6.

FIG. 6 is a sectional view showing a light emitting device according to a fourth embodiment. FIG. 7 is a partial enlarged view showing the light emitting device of FIG. 6. In the following description of the fourth embodiment, the same elements as those of the disclosed embodiment will be understood by making reference to the description of the disclosed embodiment.

Referring to FIGS. 6 and 7, the light emitting device includes a body 110 having a cavity 111, a plurality of electrodes 141 and 143 coupled to the body 110, a plurality of first and second lead electrodes 145 and 147 provided on a bottom surface of the body 110, a light emitting chip 131 provided in the cavity 111, a transparent window 161 on the cavity 111, and adhesive members 121 and 123 between an outer portion of the transparent window 161 and the body 110.

The body 110 includes a stepped structure 12 provided at an upper circumference of the cavity 111 and a groove 112 provided in the stepped structure 12. The stepped structure 12 may include the groove 112. The groove 112 may be provided along the upper circumference of the body 110. The groove 112 may be provided outside a bottom 13 of the stepped structure 12. In this case, a lateral side 15 of the stepped structure 12 may vertically extend to an inner side of the groove 112 to guide an outer lateral side of the transparent window 161.

The groove 112 may be provided at a depth D1 lower than a depth D2 of the cavity 111 based on the top surface of the body 110. The groove 112 has the depth D1 lower than the depth to the bottom 13 of the stepped structure 12 and is spaced apart from the sidewall 116 of the cavity 111. The floor 13 of the stepped structure 12 may be interposed between the groove 112 and the sidewall 116 of the cavity 111.

The transparent window 161 is provided at an outer lower portion thereof with a protrusion extending downward of the body 110. The protrusion 165 may include a single protrusion or a plurality of protrusions formed at the circumference of the outer bottom surface of the transparent window 161. If the single protrusion 165 is provided, the transparent window 161 may be provided in a roof shape. If the plural protrusions 165 are provided, one protrusion may be provided on each sidewall 116 of the cavity 111.

The height D3 of the protrusion 165 may be equal to or thinner to the thickness of the transparent window 161, but the embodiment is not limited thereto. When the height D3 of the protrusion 165 is provided higher than the thickness of the transparent window 161, the depth of the cavity 111 and the depth of the stepped structure 12 are more deepened, so that the thickness of the light emitting device may be increased.

The distance between the protrusions provided at opposite sides of the cavity 111 among the protrusions 165 of the transparent window 161 may be wider than the width of the bottom of the cavity 111.

The adhesive members 121 and 123 includes a first adhesive member 121 provided in the groove 112 and bonded to the protrusion 165 of the transparent window 161 and a second adhesive member 123 interposed between an outer top surface of the transparent window 161 and a top surface of the body 110.

The first adhesive member 121 may be provided in the groove 112 to be bonded to the circumference of the protrusion 165. A portion of the first adhesive member 121 may extend between the outer bottom surface of the transparent window 161 and the bottom 13 of the stepped structure 12 for the bonding.

The second adhesive member 123 is bonded between the outer top surface of the transparent window 161 and the top surface of the body 110 to block moisture from being infiltrated into an area between the transparent window 161 and the top surface of the body 110.

In addition, a portion 124 of the second adhesive member 123 bonds an outer lateral side of the transparent window 161 with the lateral side of the stepped structure 12 to block moisture from being infiltrated. In addition, the portion 124 of the second adhesive member 123 may be bonded to the first adhesive member 121 to improve the effect of blocking moisture. When an inclined structure may be further provided between the stepped structure 12 and the top surface 11 of the body 110, the bonding area of the second adhesive member 123 can be increased, but the embodiment is not limited thereto.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

Figure 8:
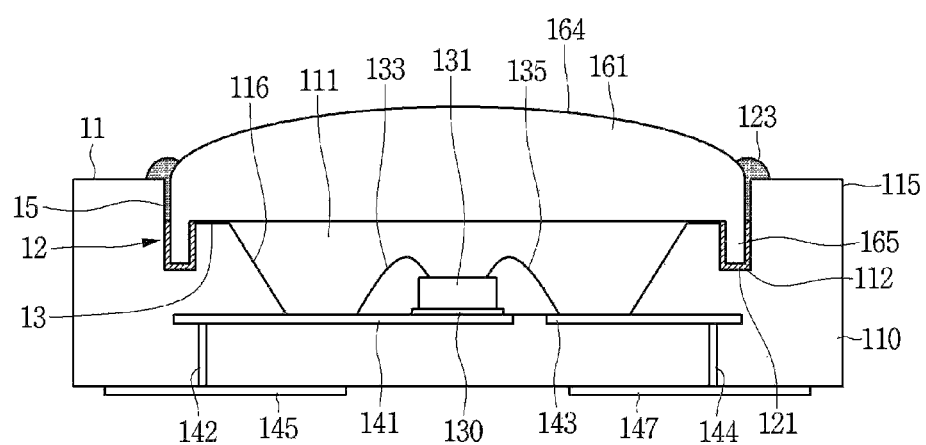
FIG. 8 is a sectional view showing a light emitting device according to a fifth embodiment.

FIG. 8 is a sectional view showing a light emitting device according to a fifth embodiment. In the following description of the fifth embodiment, the same elements as those of the disclosed embodiment will be understood by making reference to the description of the disclosed embodiment.

Referring to FIG. 8, the light emitting device includes a body 110 having a cavity 111, a plurality of electrodes 141 and 143 coupled to the body 110, a plurality of first and second lead electrodes 145 and 147 provided on a bottom surface of the body 110, a light emitting chip 131 provided in the cavity 111, a transparent window 161 on the cavity 111, and adhesive members 121 and 123 between an outer portion of the transparent window 161 and the body 110.

At least one of a top surface 164 and a bottom surface of the transparent window 161 may include a curved surface. For example, the top surface 164 of the transparent window 161 may include the curved surface, and the curved surface may guide light to a predetermined area, so that the light extraction efficiency can be improved. The curved surface may have a hemi-spherical shape or an oval shape.

The transparent window 161 may have a thickness gradually reduced toward the outer portion of the transparent window 161 from the center of the transparent window 161 due to the shape of the curved shape.

The adhesive members 121 and 123 includes a first adhesive member 121 interposed between an outer bottom surface of the transparent window 161 and a stepped structure 12 of the body 110 and a second adhesive member 123 between the outer portion of the transparent window 161 and the body 110. The second adhesive member 123 may be bonded onto the curved surface of the transparent window 161, which is the top surface 164 of the transparent window 161. Accordingly, the second adhesive member 123 may increase the bonding area with the top surface 164 of the transparent window 161.

The protrusion 165 of the transparent window 161 may be bonded to the groove 112 of the stepped structure 12 of the body 110 by the first adhesive member 121 filled in the groove 112. The groove 112 and the protrusion 165 may not be formed, and an inclined structure may be further provided on the stepped structure 12, but the embodiment is not limited thereto.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

Figure 9:
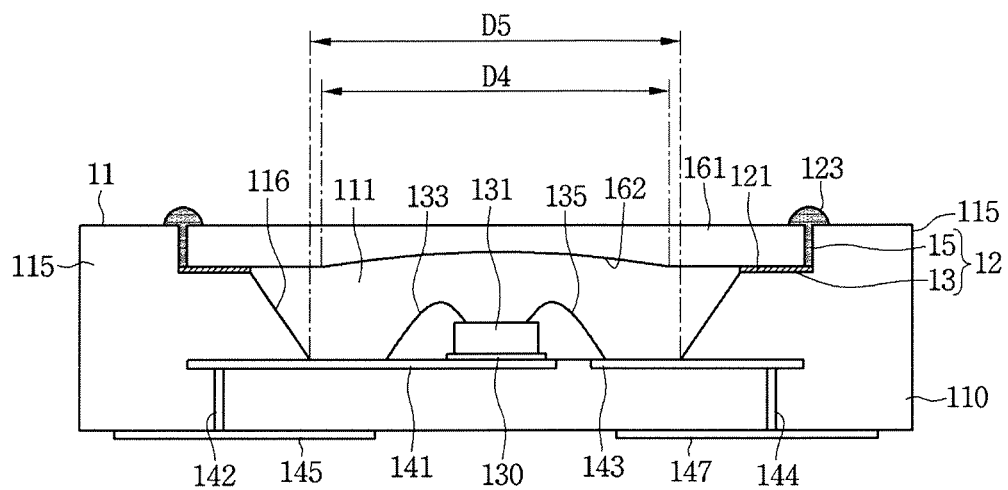
FIG. 9 is a sectional view showing a light emitting device according to a sixth embodiment.

FIG. 9 is a sectional view showing a light emitting device according to a sixth embodiment. In the following description of the sixth embodiment, the same elements as those of the disclosed embodiment will be understood by making reference to the description of the disclosed embodiment.

Referring to FIG. 8, the light emitting device includes a body 110 having a cavity 111, a plurality of electrodes coupled to the body 110, a light emitting chip 131 provided in the cavity 111, a transparent window 161 on the cavity 111, and adhesive members 121 and 123 between an outer portion of the transparent window 161 and the body 110.

At least one of a top surface and a bottom surface 162 of the transparent window 161 may include a curved surface. For example, the bottom surface 162 of the transparent window 161 may include the curved surface. A linear distance D4 of the curved surface may be equal to or less than a width D5 of the bottom of the cavity 111.

The thickness of the transparent window 161 is thinnest at the center thereof and gradually increased toward the outer portion from the center due to the shape of the curved surface of the bottom surface 162. Since the bottom surface 162 of the transparent window 161 has the shape of the curved surface, the critical angle of the light incident into the curved surface may be varied so that the light extraction efficiency can be improved.

The outer bottom surface of the transparent window 161 is provided in the shape of a flat surface, so that the outer bottom surface of the transparent window 161 may be bonded to the stepped structure 12 by the first adhesive member 121. The second adhesive member 123 is provided to bond the outer portion of the transparent window 161 to a top surface of the body 110.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

Figure 10:
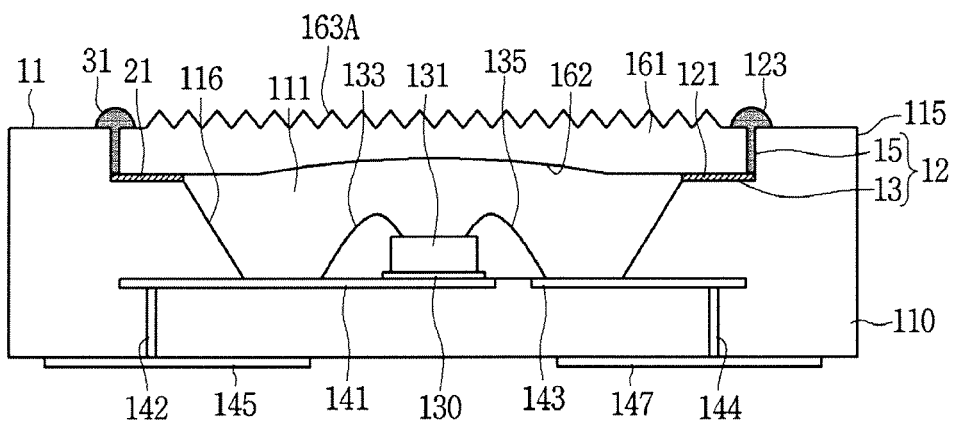
FIG. 10 is a sectional view showing a light emitting device according to a seventh embodiment.

FIG. 10 is a side sectional view showing a light emitting device according to a seventh embodiment. In the following description of the seventh embodiment, the same elements as those of the disclosed embodiment will be understood by making reference to the description of the disclosed embodiment.

Referring to FIG. 10, the light emitting device includes a body 110 having a cavity 111, a plurality of electrodes 141 and 143 coupled to the body 110, a plurality of first and second lead electrodes 145 and 147 provided on a bottom surface of the body 110, a light emitting chip 131 provided in the cavity 111, a transparent window 161 on the cavity 111, and adhesive members 121 and 123 between an outer portion of the transparent window 161 and the body 110.

At least one or all of a top surface and a bottom surface 162 of the transparent window 161 include curved surfaces. For example, the bottom surface 162 of the transparent window 161 may be a flat surface or a curved surface, and the top surface of the transparent window 161 may be a flat surface or a curved surface.

A concavo-convex pattern 163A may be provided on the top surface of the transparent window 161. The concavo-convex pattern 163A may be provided at an entire portion of the top surface of the transparent window 161 to change the path of extracting the light.

The adhesive members 121 and 123 include the first and second adhesive members 121 and 123. The first adhesive member 121 may bond an outer bottom surface of the transparent window 161 onto the stepped structure 12, and the second adhesive member 123 may bond an outer top surface of the transparent window 161 onto a top surface of the body 110. The first and second adhesive members 121 and 123 may fix the transparent window 161 and block moisture from being infiltrated.

The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

Figure 11:
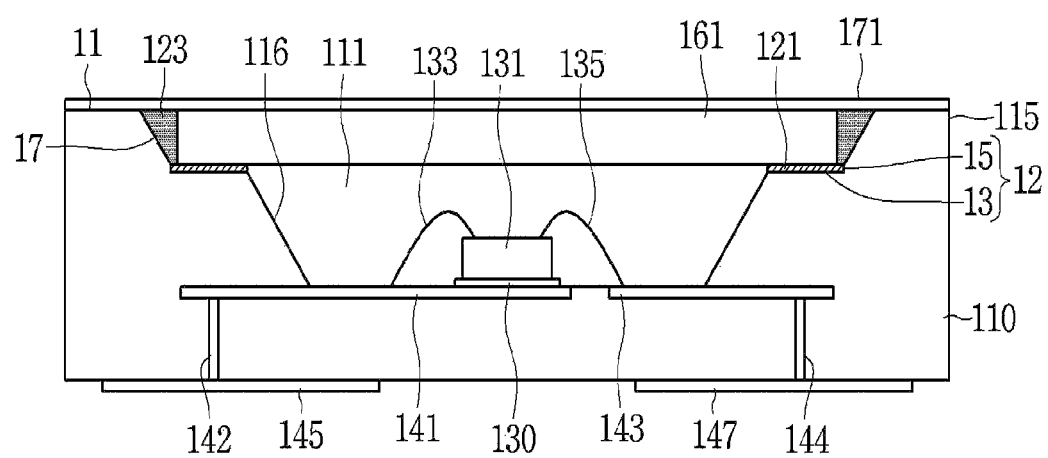
FIG. 11 is a sectional view showing a light emitting device according to an eighth embodiment.

FIG. 11 is a sectional view showing a light emitting device according to an eighth embodiment. In the following description of the eighth embodiment, the same elements as those of the disclosed embodiment will be understood by making reference to the description of the disclosed embodiment.

Referring to FIG. 11, the light emitting device includes a body 110 having a cavity 111, a plurality of electrodes 141 and 143 coupled to the body 110, a plurality of first and second lead electrodes 145 and 147 provided on a bottom surface of the body 110, a light emitting chip 131 provided in the cavity 111, a transparent window 161 on the cavity 111, adhesive members 121 and 123 between an outer portion of the transparent window 161 and the body 110, and a water-proof layer 171.

The body 110 includes a stepped structure 12 and an inclined structure 17. The adhesive members 121 and 123 include the first and second adhesive members 121 and 123. The first adhesive member 121 is interposed between the transparent window 161 and the stepped structure 12 of the body 110 to bond the transparent window 161 to the stepped structure 12 of the body 110.

The first adhesive member 121 may be interposed between a lateral side of the transparent window 161 and an inclined structure 17 of the body 10 to bond the outer portion of the transparent window 161 to the inclined structure 17. The first and second adhesive members 121 and 123 may fix the transparent window 161 to block the infiltration of moisture. The inclined structure 17 may not be formed, but the embodiment is not limited thereto.

A water-proof layer 171 may be provided on the transparent window 161. The water-proof layer 171 may extend from the top surface of the transparent window 161 to the top surface of the body 110. The water-proof layer 171 may be bonded onto the second adhesive member 123. The first and second adhesive members 121 and 123 may include silicon, a Teflon film, an Ag paste, a UV adhesive, a Pb-free low-temperature glass, an acrylic adhesive or a ceramic adhesive. The first and second adhesive members 121 and 123 may include mutually different materials, but the embodiment is not limited thereto.

The water-proof layer 171 may include a silicon material or a Teflon film, and may include a material equal to or different from those of the first and second adhesive members 121 and 123. The water-proof layer 171 may be bonded to the transparent window 161, the second adhesive member 123, and the top surface of the body 110 to effectively block water or moisture. The water-proof layer 171 extends along the lateral side of the body 110 and to the bottom surface of the body 110 to waterproof the body 110.

Figure 12:
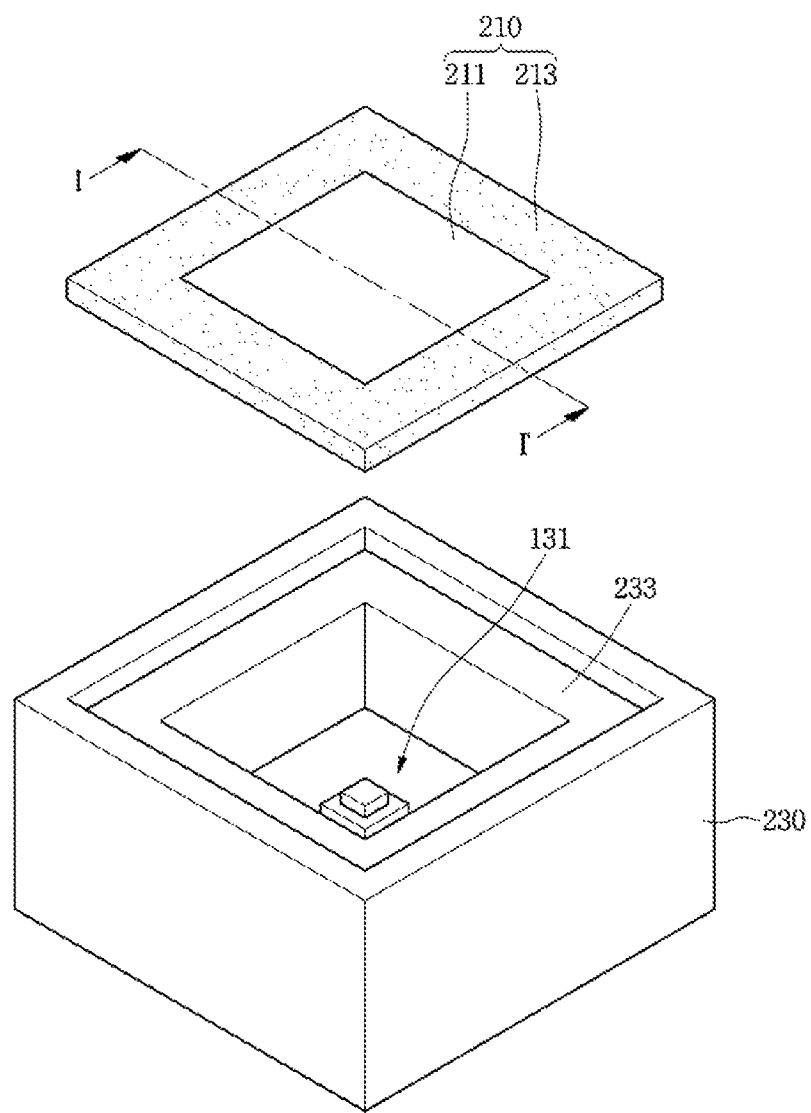
FIG. 12 is a perspective view showing a light emitting device according to a ninth embodiment.
Figure 13:
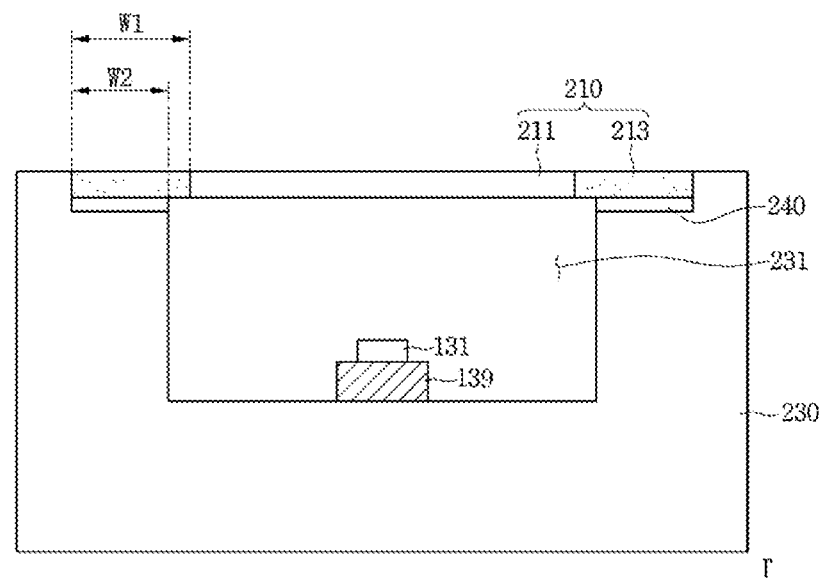
FIG. 13 is a sectional view showing the light emitting device taken along line I-I' of FIG. 12.

FIG. 12 is a perspective view showing a light emitting device according to a ninth embodiment. FIG. 13 is a sectional view showing a light emitting chip package taken along line I-I' of FIG. 12.

Referring to FIGS. 12 and 13, a light emitting chip package 200 includes a body 230, a light emitting chip 131, and a transparent window 210.

The light emitting chip 131 may emit a UV-C wavelength, that is, an ultra-violent wavelength in the range of 131 nm to 280 nm, but the embodiment is not limited thereto. In other words, the light emitting chip 131 may emit at least one of a visible ray wavelength and a UV wavelength.

The light emitting chip 131 may be mounted on a sub-frame 139, and the sub-frame 139 may directly make contact with the body 230. The sub-frame 139 may have a heat radiation function. In addition, the sub-frame 139 may make contact with an electrode of the light emitting chip 131 to perform a pad function.

Although not shown in drawings, the light emitting chip 131 may be electrically connected with the body 230 through at least one wire according to the types of light emitting chips.

The body 230 may include a cavity 231 having an open upper portion, and the light emitting chip 131 may be mounted on a bottom surface of the cavity 231.

The body 230 may include a lamination structure having a plurality of insulating layers.

The body 230 may include $SiO_2$, $Si_xO_y$, $Si_3N_4$, $Si_xN_y$, $SiO_xN_y$, $Al_2O_3$, or AlN and may have a lamination structure including a plurality of ceramic layers.

Although not shown in drawings, when the body 230 is formed of an electrical conductive material, an insulating layer may be provided on the surface of the body 230.

The insulating layer can prevent the electrical short between different electrodes of the light emitting chip 131.

The body 230 may include a plurality of lead electrodes (not shown).

The lead electrode may include metal including at least one of Ti, Cu, Ni, and Au. In addition, the lead electrodes may be selectively formed using a plating scheme, a deposition scheme, or a photolithography scheme, but the embodiment is not limited thereto.

The light emitting diode package 200 includes an adhesive 240 to bond the transparent window 210 to the body.

The adhesive 240 may seamlessly extend along a bottom surface of an edge of the transparent window 210.

The adhesive 240 may be located onto a stepped part 233 formed along an edge of the cavity 231.

In other words, a top surface of the adhesive 240 may directly make contact with the bottom surface of the edge of the transparent window 210, and a bottom surface of the adhesive 240 may directly make contact with the surface of the stepped part 233.

The transparent window 210 includes a transmissive part 211 transmitting a UV wavelength and a blocking part 213 to block the UV wavelength.

The transmissive part 211 includes an optical material having high transmittance for the UV wavelength from the light emitting chip 131. For example, the transmissive part may include Quartz, but the embodiment is not limited thereto. The bottom surface of the transmissive part 211 exposed to the blocking part 213 may have a width narrower than that of the cavity 231.

The blocking part 213 may surround an outer lateral side of the transmissive part 211 while extending outward of the outer lateral side of the transmissive part 211.

The blocking part 213 may be located in parallel to the transmissive part 211.

In other words, the blocking part 213 may be located in line with the transmissive part 211. The blocking part 213 may be integrated with the transmissive part 211.

The blocking part 213 may include glass that is transparent and prevents the UV wavelength from being transmitted, but the embodiment is not limited thereto.

The blocking part 213 has a function of blocking a path on which photons of the UV wavelength emitted from the light emitting chip 131 are transmitted to the adhesive 240 through the transmissive part 211.

In other words, the blocking part 213 may improve defect failure of damaging the adhesive 240 by the photons of the UV wavelength.

The blocking part 213 may include an area overlapped with the adhesive 240. In detail, the width W1 of the blocking part 213 may be equal to or wider than the width W2 of the adhesive 240.

A portion of the blocking part 213 is bonded to the adhesive 240 and overlapped with the adhesive 240, and another portion of the blocking part 213 may extend inward of the cavity 231, but the embodiment is not limited thereto. In other words, the blocking part 213 and the adhesive 240 may have equal widths, and may be overlapped with each other at entire portions thereof.

In this case, the adhesive 240 may be spaced apart from the transmissive part 211 by a predetermined distance.

According to the light emitting chip package 200 of the ninth embodiment, the blocking part 213, which blocks the UV wavelength, is located at the edge of the transmissive part 211 which transmits the UV wavelength, and the adhesive 240 is bonded to the blocking part 213, thereby preventing the adhesive 240 from being damaged by the photons of the UV wavelength.

According to the light emitting chip package 200 of the ninth embodiment, the reliability in the coupling between the body 230 and the transparent window 210 can be improved by preventing the damage to the adhesive 240. Accordingly, the yield rate may be improved.

Figure 14:
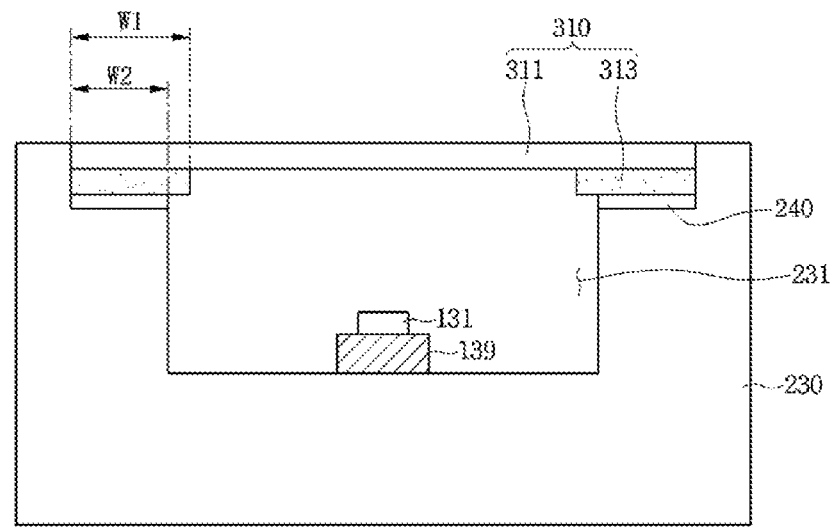
FIG. 14 is a sectional view showing a light emitting device according to a tenth embodiment.

FIG. 14 is a sectional view showing a light emitting device according to a tenth embodiment.

Referring to FIG. 14, a light emitting device 300 according to the tenth embodiment includes a transparent window 310, a body 230, a light emitting chip 131, and a sub-frame 139.

The body 230, the light emitting chip 131, and the sub-frame 139 may employ technical features according to the embodiment of FIG. 12.

The transparent window 310 includes a transmissive part 311 which transmits a UV wavelength and a blocking part 313 to block the UV wavelength.

The transmissive part 311 includes an optical material having high transmittance for the UV wavelength from the light emitting chip 131. For example, the transmissive part 311 may include Quartz, but the embodiment is not limited thereto. A bottom surface of the transmissive part 311 exposed to the blocking part 313 may have a width narrower than that of the cavity 231.

The blocking part 313 may be located on a bottom surface of an edge of the transmissive part 311. The blocking part 313 may seamlessly extend along the bottom surface of the edge of the transmissive part 311. The blocking part 313 may be integrated with the transmissive part 311. The blocking part 313 may be interposed between the transmissive part 311 and the adhesive 240.

The blocking part 313 may include glass that is transparent and blocks the UV wavelength from being transmitted, but the embodiment is not limited thereto.

The blocking part 313 has a function of blocking a path on which photons of the UV wavelength emitted from the light emitting chip 131 are transmitted to the adhesive 240 through the transmissive part 311. In other words, the blocking part 313 may improve defect failure of damaging the adhesive 240 by the photons of the UV wavelength.

The blocking part 313 may include an area overlapped with the transmissive part 311 and the adhesive 240. In detail, the width W1 of the blocking part 313 may be wider than or equal to the width W2 of the adhesive 240.

The top surface of the blocking part 313 may directly make contact with the bottom surface of the transmissive part 311, and the bottom surface of the blocking part 313 may directly make contact with the adhesive 240.

A portion of the blocking part 313 may extend inward of the cavity 231, but the embodiment is not limited thereto. For example, the blocking part 313 and the adhesive 240 having equal widths may be overlapped with each other at the entire portions thereof.

The adhesive 240 may be spaced apart from the transmissive part 311 by a predetermined distance.

According to the light emitting device 300 of the tenth embodiment, the blocking part 313, which blocks the UV wavelength, is located at the edge of the transmissive part 311 which transmits the UV wavelength, and the adhesive 240 is bonded to the blocking part 313, thereby preventing the adhesive 240 from being damaged by the photons of the UV wavelength.

Therefore, according to the light emitting device 300 of the embodiment, the reliability in the coupling between the body 230 and the transparent window 310 can be improved by preventing the damage to the adhesive 240. Accordingly, the yield rate may be improved.

Figure 15:
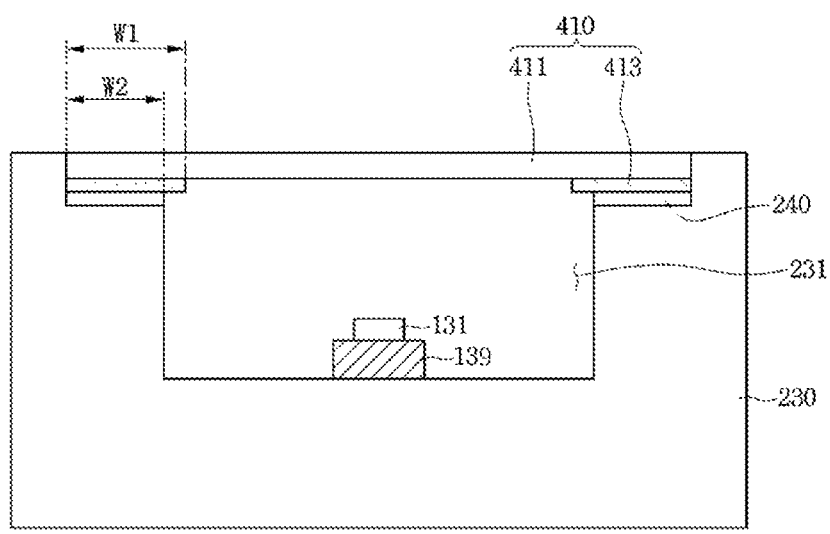
FIG. 15 is a sectional view showing a light emitting device according to an eleventh embodiment.

FIG. 15 is a sectional view showing a light emitting device according to an eleventh embodiment.

Referring to FIG. 15, a light emitting device 400 according to an eleventh embodiment includes a transparent window 410, a body 230, a light emitting chip 131, and a sub-frame 139.

The body 230, the light emitting chip 131, and the sub-frame 139 may employ technical features according to the embodiment of FIG. 12.

The transparent window 410 includes a transmissive part 311 which transmits a UV wavelength and a blocking part 413 to block the UV wavelength.

The transmissive part 411 includes an optical material having high transmittance for the UV wavelength from the light emitting chip 131. For example, the transmissive part 411 may include Quartz, but the embodiment is not limited thereto. A bottom surface of the transmissive part 411 exposed to the blocking part 413 may have a width narrower than that of the cavity 231.

The blocking part 413 may be located on a bottom surface of an edge of the transmissive part 411. The blocking part 413 may seamlessly extend along the bottom surface of the edge of the transmissive part 411. The blocking part 413 may be integrated with the transmissive part 411. The blocking part 413 may be interposed between the transmissive part 411 and the adhesive 240.

The blocking part 413 may include ITO that is transparent and blocks the UV wavelength from being transmitted, but the embodiment is not limited thereto. The blocking part 413 may be formed on the bottom surface of the first transmissive part 411 through an etching process using a photoresist and a printing process.

The blocking part 413 has a function of blocking a path on which photons of the UV wavelength emitted from the light emitting chip 131 are transmitted to the adhesive 240 through the transmissive part 311. In other words, the blocking part 413 may improve defect failure of damaging the adhesive 240 by the photons of the UV wavelength.

The blocking part 413 may include an area overlapped with the transmissive part 411 and the adhesive 240. In detail, the width W1 of the blocking part 413 may be wider than or equal to the width W2 of the adhesive 240.

The top surface of the blocking part 413 may directly make contact with the bottom surface of the transmissive part 411, and the bottom surface of the blocking part 413 may directly make contact with the adhesive 240.

A portion of the blocking part 413 may extend inward of the cavity 231, but the embodiment is not limited thereto. For example, the blocking part 413 and the adhesive 240 having equal widths may be overlapped with each other at the entire portions thereof.

The adhesive 240 may be spaced apart from the transmissive part 411 by a predetermined distance.

According to the light emitting chip 400 of the eleventh embodiment, the blocking part 413, which blocks the UV wavelength, is located at the bottom surface of the edge of the transmissive part 411 which transmits the UV wavelength, and the adhesive 240 is bonded to the blocking part 413, thereby preventing the adhesive 240 from being damaged by the photons of the UV wavelength.

Therefore, according to the light emitting device 300 of the embodiment, the reliability in the coupling between the body 230 and the transparent window 410 can be improved by preventing the damage to the adhesive 240. Accordingly, the yield rate may be improved.

Figure 16:
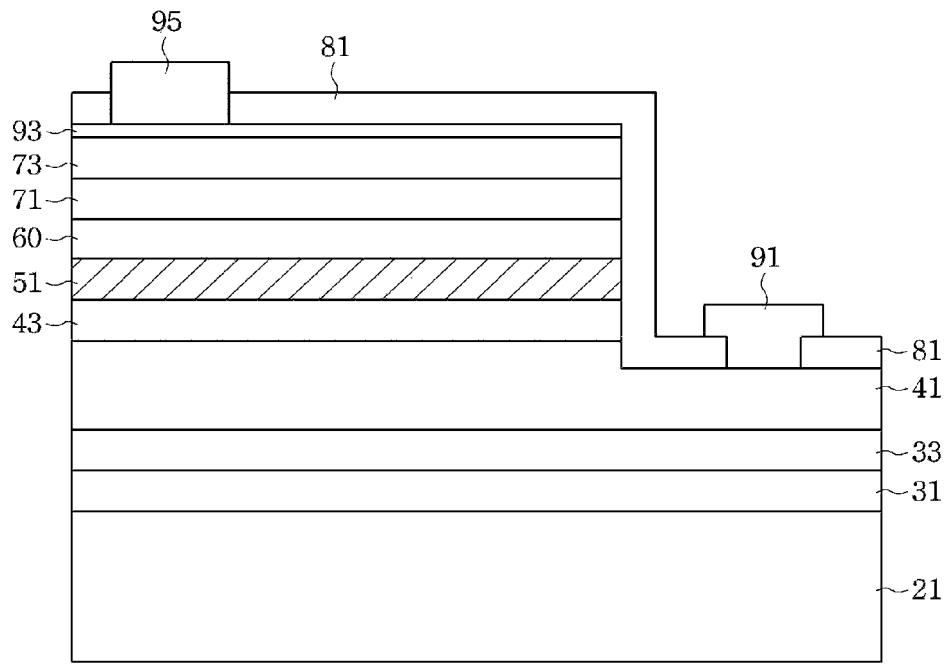
FIG. 16 is a sectional view showing one example of a light emitting chip according to the embodiment.

FIG. 16 is a sectional view showing one example of a light emitting chip according to the embodiment.

Referring to FIG. 16, a light emitting chip 101 may include a first conductive semiconductor layer 41, an active layer 51 on the first conductive semiconductor layer 41, an electron blocking structure layer 60 on the active layer 51, and a second conductive semiconductor layer 73 on the electron blocking structure layer 60.

The light emitting chip 101 may include at least one or all of a low conductive layer 33, a buffer layer 31, and a substrate 21 under the first conductive semiconductor layer 41.

The light emitting chip 101 may include at least one or all of a first clad layer 43 interposed between the first conductive semiconductor layer 41 and the active layer 51, and a second clad layer 71 interposed between the active layer 51 and the second conductive semiconductor layer 73.

The light emitting chip 101 may be a UV light emitting diode having a wavelength in the range of 200 nm to 405 nm. In other words, the light emitting chip 101 may emit the wavelength in the range of 200 nm to 289 nm, or the wavelength in the range of 290 nm to 319 nm, or the wavelength in the range of 320 nm to 405 nm.

For example, the substrate 21 may include a light transmissive substrate, a conductive substrate, or an insulating substrate. For example, the substrate 21 may include at least one of sapphire ($Al_2O_3$), SiC, Si, GaAs, GaN, ZnO, GaP, InP, Ge, and $Ga_2O_3$. A plurality of protrusion parts (not shown) may be formed on the top surface and/or the bottom surface of the substrate 21. Each of the protrusions has a side sectional surface in at least one of a hemi-spherical shape, a polygonal shape, and oval shape, and the protrusions may be arranged in the shape of a stripe or a matrix. The protrusions may improve the light extraction efficiency.

A plurality of compound semiconductor layers may be grown on the substrate 21. The growing equipment of the compound semiconductor layers includes an electron beam, a physical vapor deposition (PVD), a chemical vapor deposition (CVD), a plasma laser deposition (PLD), a dual-type thermal evaporator, a sputtering scheme, or a metal organic chemical vapor deposition (MOCVD), but the embodiment is not limited thereto.

The buffer layer 31 may be interposed between the substrate 21 and the first conductive semiconductor layer 41. The buffer layer 31 may be formed at at least one layer using group II to VI compound semiconductors. The buffer layer 31 may include a semiconductor layer using the group III-V compound semiconductors. For example, the buffer layer 31 may be realized using a semiconductor material having the compositional formula of $In_xAl_yGa_{1-x-y}N$ ($0 \leq x \leq 1$, $0 \leq y \leq 1$, $0 \leq x+y \leq 1$). For example, the buffer layer 31 includes at least one of materials such as GaN, AlN, AlGaN, InGaN, InN, InAlGaN, AlInN, AlGaAs, GaP, GaAs, GaAsP, AlGaInP, and ZnO.

The buffer layer 31 may be formed in a super lattice structure in which mutually different semiconductor layers are alternately arranged. The buffer layer 31 may be formed to reduce the difference in a lattice constant between the substrate 21 and the nitride-based semiconductor layer, and may serve as a defect control layer. The buffer layer 31 may have a value between the lattice constants of the substrate 21 and the nitride-based semiconductor layer. The buffer layer 31 may not be formed, but the embodiment is not limited thereto.

The low conductive layer 33 may be provided between the buffer layer 31 and the first conductive semiconductor layer 41. The lower conductive layer 33 serves as an undoped semiconductor layer, and has electrical conductivity lower than that of the first conductive semiconductor layer 41.

The low conductive layer 33 may be realized using the group II to VI compound semiconductors, in detail, the group III to V compound semiconductors, and the undoped semiconductor layer has a first conductive characteristic even if the undoped semiconductor layer is not doped with conducive dopants unintentionally. The undoped semiconductor layer may not be formed, but the embodiment is not limited thereto. The low conductive layer 33 may include at least one of GaN, AlN, AlGaN, InGaN, InN, InAlGaN, AlInN, AlGaAs, GaP, GaAs, GaAsP, and AlGaInP. The low conductive layer 33 may not be formed, but the embodiment is not limited thereto.

The first conductive semiconductor layer 41 may be interposed between at least one of the substrate 21, the buffer layer 31, and the lower conductive layer 33 and the active layer 51. The first conductive semiconductor layer 41 may be realized using at least one of the group III to V compound semiconductors and the group II to VI compound semiconductors doped with first conductive dopants.

The first conductive semiconductor layer 41 may be formed of a semiconductor material having a compositional formula of, for example $In_xAl_yGa_{1-x-y}N$ ($0 \leq x \leq 1$, $0 \leq y \leq 1$, $0 \leq x+y \leq 1$). The first conductive semiconductor layer 41 may include at least one of GaN, AlN, AlGaN, InGaN, InN, InAlGaN, AlInN, AlGaAs, GaP, GaAs, GaAsP, and AlGaInP, and may include an N type semiconductor layer doped with N type dopants such as Si, Ge, Sn, Se, and Te.

The first conductive semiconductor layer 41 may be provided at a single layer or a multiple layer. The first conductive semiconductor layer 41 may be formed in a super lattice structure in which at least two layers different from each other are alternately arranged. The first conductive semiconductor layer 41 may include an electrode contact layer.

The first clad layer 43 may include an AlGaN based semiconductor. The first clad layer 43 may be an N type semiconductor layer having first conductive dopants, for example N type dopants. The first clad layer 43 may include at least one of GaN, AlN, AlGaN, InGaN, InN, InAlGaN, AlInN, AlGaAs, GaP, GaAs, GaAsP, and AlGaInP, and may be an N type semiconductor layer doped with N type dopants such as Si, Ge, Sn, Se, and Te.

The first conductive semiconductor layer 41 and the first clad layer 43 may include AlGaN-based semiconductors in order to prevent the UV wavelength from being absorbed.

The active layer 51 may be formed in at least one of a single well structure, a single quantum well structure, a multiple well structure, a multiple quantum well (MQW) structure, a quantum wire structure, and a quantum dot structure.

The active layer 51 emits light due to the difference in the energy band gap between materials constituting the active layer 51 as electrons (or holes) injected through the first conductive semiconductor layer 41 meet holes (or electrons) injected through the second conductive semiconductor layer 73.

The active layer 51 may be realized using a compound semiconductor. The active layer 51 may be realized using, for example at least one of group II-VI compound semiconductors and group III-V compound semiconductors.

When the active layer 51 is realized in the multiple well structure, the active layer 51 includes a plurality of well layers and a plurality of barrier layers. The active layer 51 is formed by alternately arranging the well layer and the barrier layer. Pairs of the well layer and the barrier layer may be formed in 2 to 30 cycles.

For example, the well layer may include a semiconductor material having a compositional formula of $In_xAl_yGa_{1-x-y}N$ ($0 \le x \le 1$, $0 \le y \le 1$, $0 \le x+y \le 1$). The barrier layer may include a semiconductor material having a compositional formula of $In_xAl_yGa_{1-x-y}N$ ($0 \le x \le 1$, $0 \le y \le 1$, $0 \le x+y \le 1$).

For example, the cycle of the well layer/barrier layer includes at least one of pairs of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The well layer of the active layer 51 according to the embodiment may be realized using AlGaN, and the barrier layer may be realized using AlGaN. The active layer 51 may emit the UV wavelength. The Al composition of the barrier layer is higher than the Al composition of the well layer. The Al composition of the well layer may be in the range of 20% to 50%, and the Al composition of the barrier layer may be in the range of 40% to 95%.

Meanwhile, the electron blocking structure layer 60 has a multiple layer structure. The electron blocking structure layer 60 includes a material containing 50% or more of the Al composition, or a material containing the same Al composition as that of the barrier layer, or a material having a higher composition. The electron blocking structure layer 60 may include an AlGaN semiconductor provided at a single layer or a multiple layer, and may include a P type dopant.

The second clad layer 71 is provided on the electron blocking structure layer 60. The second clad layer 71 is interposed between the electron blocking structure layer 60 and the second conductive semiconductor layer 73.

The second clad layer 71 may include an AlGaN-based semiconductor. The second clad layer 71 may be a P type semiconductor having a second conductive dopant such as a P type dopant. The second clad layer 71 may include at least one of GaN, AlN, AlGaN, InGaN, InN, InAlGaN, AlInN, AlGaAs, GaP, GaAs, GaAsP, and AlGaInP, and may include a P type dopant such as Mg, Zn, Ca, Sr, or Ba.

The second conductive semiconductor layer 73 may be provided on the second clad layer 71. The second conductive semiconductor layer 73 may include a semiconductor material having a compositional formula of $In_xAl_yGa_{1-x-y}N$ ($0 \le x \le 1$, $0 \le y \le 1$, $0 \le x+y \le 1$). For example, the second conductive semiconductor layer 73 may include at least one of GaN, AlN, AlGaN, InGaN, InN, InAlGaN, AlInN, AlGaAs, GaP, GaAs, GaAsP, and AlGaInP, and may include a P type semiconductor layer doped with the P type dopant.

The second conductive semiconductor layer 73 may be provided at a single layer or a multiple layer. The second conductive semiconductor layer 73 may be formed in a super lattice structure in which at least two layers different from each other are alternately arranged. The second conductive semiconductor layer 73 may be an electrode contact layer. The second conductive semiconductor layer 73 and the second clad layer 71 may include an AlGaN-based semiconductor in order to prevent the UV wavelength from being absorbed.

The light emitting structure may include layers ranging from the first conductive semiconductor layer 41 to the second conductive semiconductor layer 73. According to another example, in the light emitting structure, the first conductive semiconductor layer 41 and the first clad layer 43 can be realized using the P type semiconductor, and the second clad layer 71 and the second conductive semiconductor layer 73 may be realized using the N type semiconductor layer. The light emitting structure may be realized in one of an N-P junction structure, a P-N junction structure, an N-P-N junction structure, and a P-N-P junction structure.

The first electrode 91 is electrically connected with the first conductive semiconductor layer 41, and the second electrode 95 may be electrically connected with the second conductive semiconductor layer 73. The first electrode 91 may be provided on the first conductive semiconductor layer 41, and the second electrode 95 may be provided on the second conductive semiconductor layer 73.

The first electrode 91 and the second electrode 95 may include a current spreading pattern having an arm structure or a finger structure. The first electrode 91 and the second electrode 95 may be formed non-transmissive metal having an ohmic-contact property, a bonding layer property, and a bonding layer property, but the embodiment is not limited thereto. The first electrode 91 and the second electrode 95 may include Ti, Ru, Rh, Ir, Mg, Zn, Al, In, Ta, Pd, Co, Ni, Si, Ge, Ag, Au, or the alloy thereof.

An electrode layer 93 may be interposed between the second electrode 95 and the second conductive semiconductor layer 73. The electrode layer 93 may include a transmissive material to transmit 70% or more of light, or a material having a reflective characteristic of reflecting 70% or more light. For example, the electrode layer 93 may include metal or a metallic oxide. The electrode layer 93 may selectively include ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx, NiO, Al, Ag, Pd, Rh, Pt, or Ir.

An insulating layer 81 may be provided on the electrode layer 93. The insulating layer 81 may be provided on the top surface of the electrode layer 93 and the lateral side of the semiconductor layer, and may selectively make contact with the first and second electrodes 91 and 95. The insulating layer 81 includes an insulating material or insulating resin including at least one of an oxide, a nitride, a fluoride, and a sulfide including at least one of Al, Cr, Si, Ti, Zn, and Zr. For example, the insulating layer 81 may selectively include $SiO_2$, $Si_3N_4$, $Al_2O_3$, or $TiO_2$. The insulating layer 81 may be formed at a single layer or a multiple layer, but the embodiment is not limited thereto.

Figure 17:
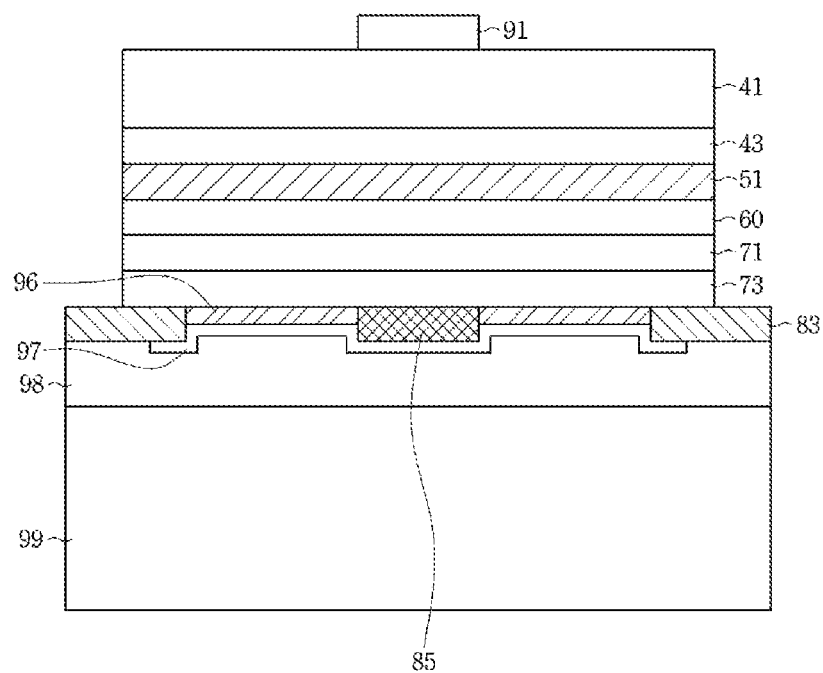
FIG. 17 is a sectional view showing another example of the light emitting chip of the light emitting device according to the embodiment.

FIG. 17 is a sectional view showing another example of the light emitting chip of the light emitting device according to the embodiment. In the following description made with reference to FIG. 17, the same elements as those shown in FIG. 16 will be understood by making reference to the description made with reference to FIG. 16.

A light emitting chip 102 of FIG. 17 includes a first electrode 91 on a first conductive semiconductor layer 41 and a plurality of conductive layers 96, 97, 98, and 99 under a second conductive semiconductor layer 73.

The second electrode is provided under the second conductive semiconductor layer 73 to include a contact layer 96, a reflective layer 97, a bonding layer 98, and a support member 99. The contact layer 96 makes contact with the semiconductor layer, for example, the second conductive semiconductor layer 73. The contact layer 96 may include a lower conductive material, such as ITO, IZO, IZTO, IAZO, IGZO, IGTO, AZO, or ATO, or metal such as Ni or Ag. The reflective layer 97 is provided under the contact layer 96, and may have a structure including at least one layer including a material selected from the group consisting of Ag, Ni, Al, Rh, Pd, Ir, Ru, Mg, Zn, Pt, Au, Hf, and the combination thereof. The reflective layer 97 may make contact with the bottom surface of the second conductive semiconductor layer 73, but the embodiment is not limited thereto.

The bonding layer 98 may be provided under the reflective layer 97. The bonding layer 98 may include barrier metal or bonding metal. For example, the bonding layer 98 may include at least one of Ti, Au, Sn, Ni, Cr, Ga, In, Bi, Cu, Ag, Ta, and the alloy of a material selected from among the above materials.

A channel layer 83 and a current blocking layer 85 are interposed between the second conductive semiconductor layer 73 and the second electrode.

The channel layer 83 may be formed along an edge of the bottom surface of the second conductive semiconductor layer 73, and may be formed in a ring shape, a loop shape, or a frame shape. The channel layer 83 include a transparent conductive material or an insulating material including at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. An inner side portion of the channel layer 163 is provided under the second conductive semiconductor layer 73, and an outer side portion of the channel layer 163 may be provided out of the lateral side of the light emitting structure.

The current blocking layer 85 may be interposed between the second conductive semiconductor layer 73 and the contact layer 96 or the reflective layer 97. The current blocking layer 85 may include an insulating material. For example, the current blocking layer 85 may include at least one of $SiO_2$, $SiO_x$, $SiO_xN_y$, $Si_3N_4$, $Al_2O_3$, $TiO_2$. According to another example, the current blocking layer 85 may include metal for the schottky contact.

The current blocking layer 85 is provided corresponding to the first electrode 91 provided on the light emitting structure in a thickness direction of the light emitting structure. The current blocking layer 85 blocks current applied thereto from the second electrode 170 to spread the current along another path. One current blocking layer or a plurality of current blocking layers may be provided. At least a portion or an entire portion of the current blocking layer 85 may be vertically overlapped with the first electrode 91.

A support member 99 may be formed under the bonding layer 98 to serve as a conductive member. The support member 99 may include a conductive material such as copper (Cu), gold (Au), nickel (Ni), molybdenum (Mo), Cu—W, or a carrier wafer (e.g., Si, Ge, GaAs, ZnO, or SiC). According to another embodiment, the support member 99 may be realized in the form of a conductive sheet.

In this case, the substrate of FIG. 16 is removed. The growth substrate may be removed through a physical scheme (e.g., laser lift off) and/or a chemical scheme (wet etching scheme) to expose the first conductive semiconductor layer 41. Isolation etching is performed in a direction that the substrate is removed, so that the first electrode 91 is formed on the first conductive semiconductor layer 41.

A light extraction structure (not shown), such as roughness, may be formed on the top surface of the first conductive semiconductor layer 41. An insulating layer (not shown) may be further provided on the surface of the semiconductor layer, but the embodiment is not limited thereto. Accordingly, there can be fabricated a light emitting device 102 having a vertical type electrode structure in which the first electrode 91 is provided on the light emitting structure and the support member 99 is provided under the light emitting structure.

The light emitting device according to the embodiment may be applied to a light unit. The light unit may serve as an assembly having one light emitting device or a plurality of light emitting devices, or a light emitting device package. The light unit may include a UV lamp.

Figure 18:
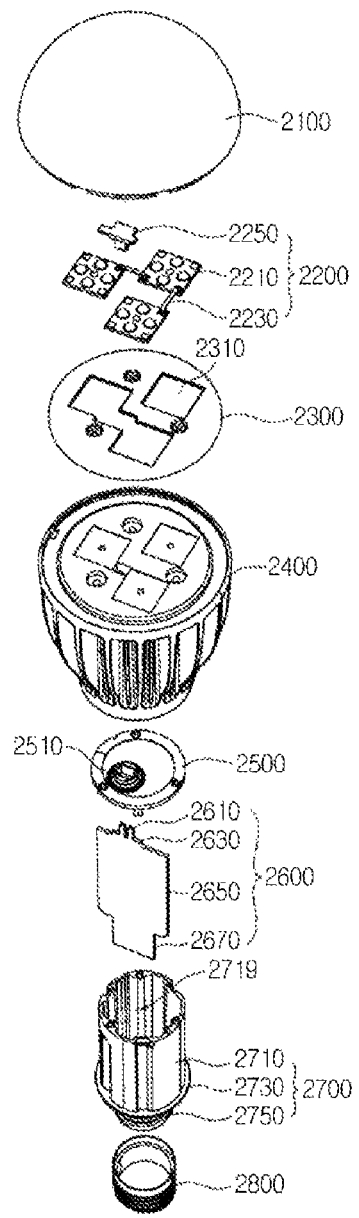
FIG. 18 is a perspective view showing a lighting device according to the embodiment.

FIG. 18 is a perspective view showing a lighting device according to the embodiment.

Referring to FIG. 18, the light device according to the embodiment may include a cover 2100, a light source module 2200, a radiator 2400, a power supply part 2600, an inner case 2700, and a socket 2800. In addition, the light device according to the embodiment may further include at least one of a member 2300 and a holder 2500. The light source module 2200 may include a light emitting device according to the embodiment.

For example, the cover 2100 may have a blub shape, a hemisphere shape, a partially-open hollow shape. The cover 2100 may be optically coupled to the light source module 2200. For example, the cover 2100 may diffuse, scatter, or excite light provided from the light source module 2200. The cover 2100 may be a type of optical member. The cover 2100 may be coupled to the radiator 2400. The cover 2100 may include a coupling part which is coupled to the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. Accordingly, the light emitted from the light source module 2200 may be sufficiently scattered and diffused to be discharged to the outside.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent to be viewed from the outside, or opaque. The cover 2100 may be formed through a blow molding scheme.

The light source module 2200 may be provided at one surface of the radiator 2400. Accordingly, the heat from the light source module 2200 is conducted to the radiator 2400. The light source module 2200 may include a light source 2210, a connection plate 2230, and a connector 2250.

The member 2300 is provided at a top surface of the radiator 2400, and includes guide grooves 2310 into which a plurality of light sources 2210 and the connector 2250 are inserted. The guide grooves 2310 correspond to a substrate of the light source 2210 and the connector 2250.

A light reflective material may be applied to or coated on a surface of the member 2300. For example, white paint may be applied to or coated on the surface of the member 2300. The member 2300 again reflects light, which is reflected by the inner surface of the cover 2100 and returned toward the light source module 2200, toward the cover 2100. Accordingly, the light efficiency of the light device according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may include an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 has a guide protrusion 2510. The guide protrusion 2510 has a hole through a protrusion 2610 of the power supply part 2600.

The power supply part 2600 processes or converts an external electric signal and provides the processed or converted electric signal to the light source module 2200. The power supply part 2600 is received in the receiving groove of the inner case 2700, and sealed inside the inner case 2700 by the holder 2500. The power supply part 2600 may include a protrusion 2610, a guide part 2630, a base 2650, and an extension part 2670.

The guide part 2630 has a shape protruding outward from one side of the base 2650. The guide part 2630 may be inserted into the holder 2500. A plurality of components may be provided on one surface of the base 2650. For example, the components may include a DC converter converting AC power provided from an external power supply into DC power, a driving chip to control driving of the light source module 2200, and an ESD protection device to protect the light source module 2200, but the embodiment is not limited thereto.

The extension part 2670 has a shape protruding outward from an opposite side of the base 2650. The extension part 2670 is inserted into an inside of the connection part 2750 of the inner case 2700, and receives an external electric signal. For example, a width of the extension part 2670 may be smaller than or equal to a width of the connection part 2750 of the inner case 2700. One end of a "+ electric wire" and one end of a "– electric wire" may be electrically connected to the extension part 2670 and opposite ends of the "+ electric wire" and the "– electric wire" may be electrically connected to a socket 2800.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a body having a cavity and a stepped structure around the cavity;
   a plurality of electrodes in the cavity;
   a light emitting chip in the cavity;
   a transparent window having an outer portion provided on the stepped structure covering the cavity; and
   an adhesive member between the transparent window and the body,
   wherein the adhesive member comprises a first adhesive member between an outer bottom surface of the transparent window and a bottom of the stepped structure and a second adhesive member between the outer portion of the transparent window and the body,
   wherein the second adhesive member comprises a first portion on the transparent window and on the body, and a second portion between the outer portion of the transparent window and the stepped structure of the body,
   wherein a top surface of the first portion is disposed above a top surface of the transparent window,
   wherein the stepped structure comprises a groove disposed in an outer portion of the bottom of the stepped structure at a depth lower than a depth of the bottom of the stepped structure,
   wherein the transparent window comprises a protrusion extending into the groove from an outer lower portion of the transparent window, and
   wherein the first adhesive member is disposed between the groove and the protrusion.

2. The light emitting device of claim 1, wherein the second adhesive member bonds an outer top surface of the transparent window to the stepped structure of the body.

3. The light emitting device of claim 1, wherein the first adhesive member includes a material different from a material constituting the second adhesive member.

4. The light emitting device of claim 1, wherein the body comprises a ceramic material, the transparent window includes a glass material, and the light emitting chip emits an ultra-violet light.

5. The light emitting device of claim 1, further comprising:
   a first lead electrode and a second lead electrode on a bottom surface of the body; and
   a first connection electrode and a second connection electrode in the body;
   wherein the plurality of electrodes comprise a first electrode and a second electrode,
   wherein the first connection electrode is connected between the first electrode and the first lead electrode, and
   wherein the second connection is connected between the second electrode and the second lead electrode.

6. The light emitting device of claim 1, wherein the second adhesive member is disposed along each lateral side of the transparent window and protruded upward of the top surface of the body.

7. The light emitting device of claim 1, wherein the second adhesive member comprises a curved top surface.

8. The light emitting device of claim 1, wherein the depth of the groove is lower than the depth of the cavity.

9. The light emitting device of claim 1, wherein the bottom of the stepped structure is interposed between the groove and the sidewall of the cavity.

10. The light emitting device of claim 1, wherein the second portion of the second adhesive member is disposed between the lateral side of the transparent window and the lateral side of the stepped structure.

11. The light emitting device of claim 10, wherein a bottom surface of the second portion of the second adhesive member is bonded to a top surface of the first adhesive member, and wherein the bottom surface of the second portion of the second adhesive member and the bottom surface of the transparent window are disposed on the same plane.

12. The light emitting device of claim 1, wherein a bottom surface of the protrusion is disposed below the stepped structure of the body.

13. The light emitting device of claim 1, wherein the bottom of the cavity is provided above the bottom surface the groove.

14. The light emitting device of claim 1, wherein the width of the bottom of the stepped structure is larger than the width of the bottom surface the groove.

15. The light emitting device of claim 1, wherein a portion of the first adhesive member is disposed between the protrusion and the lateral side of the stepped structure.

* * * * *